United States Patent [19]
Hayashi

[11] Patent Number: 6,097,227
[45] Date of Patent: Aug. 1, 2000

[54] PHASE LOCKED LOOP CIRCUIT AND METHOD OF SYNCHRONIZING INTERNAL SYNCHRONIZING SIGNAL WITH REFERENCE SIGNAL

[75] Inventor: Tomohiro Hayashi, Tokyo, Japan

[73] Assignee: NEC Corporation, Tokyo, Japan

[21] Appl. No.: 09/114,172

[22] Filed: Jul. 13, 1998

[30] Foreign Application Priority Data

Jul. 18, 1997 [JP] Japan .................................. 9-209877

[51] Int. Cl.$^7$ ....................................................... H03L 7/06
[52] U.S. Cl. ........................................... 327/158; 327/149
[58] Field of Search ..................................... 327/146, 147, 327/148, 149, 150, 151, 152, 153, 154, 155, 156, 157, 158, 159, 160; 375/371; 331/17, DIG. 2

[56] References Cited

U.S. PATENT DOCUMENTS

| | | | |
|---|---|---|---|
| 5,170,130 | 12/1992 | Ichihara | 328/155 |
| 5,461,344 | 10/1995 | Andoh | 331/1 A |
| 5,559,474 | 9/1996 | Matsumoto et al. | 331/17 |

FOREIGN PATENT DOCUMENTS

| | | |
|---|---|---|
| 63-316929 | 12/1988 | Japan . |
| 2-2216 | 1/1990 | Japan . |
| 2-291161 | 11/1990 | Japan . |
| 3-214925 | 9/1991 | Japan . |
| 4-51717 | 2/1992 | Japan . |
| 7-30416 | 1/1995 | Japan . |
| 8-97718 | 4/1996 | Japan . |
| 8-307254 | 11/1996 | Japan . |

*Primary Examiner*—Toan Tran
*Assistant Examiner*—Anh-Quan Tra
*Attorney, Agent, or Firm*—Sughrue, Mion, Zinn, Macpeak & Seas, PLLC

[57] ABSTRACT

A phase locked loop circuit that rapidly synchronizes an internal synchronizing signal with the reference signal includes a phase detector detecting the difference between the signals, a current generator, a charge pump controlled by the phase detector generating voltage by converting current from the current generator into a control voltage, a lock detector detecting whether the phase difference between the signals is within a predetermined range, a loop filter with variable capacitance that is charged and discharged by the control voltage from the charge pump and which changes capacitance is response to lock and unlock signals from the lock detector, and a voltage controlled oscillator converting the control voltage into the internal synchronizing signal. When the phase difference between the signals is within the predetermined range, the lock detector outputs a "lock" signal to the loop filter, and the capacitance of the filter is set to be large. When the phase difference between the signals is outside of the predetermined range, the lock detector outputs a "unlock" signal to the loop filter, and the capacitance of the filter is set to be small. By changing the capacitance of the loop filter, lock-up time is reduced. The capacitance within the loop filter is maintained at the control voltage even when it is not part of the filter, preventing a drop in the control voltage induced by the adding of capacitance.

11 Claims, 9 Drawing Sheets

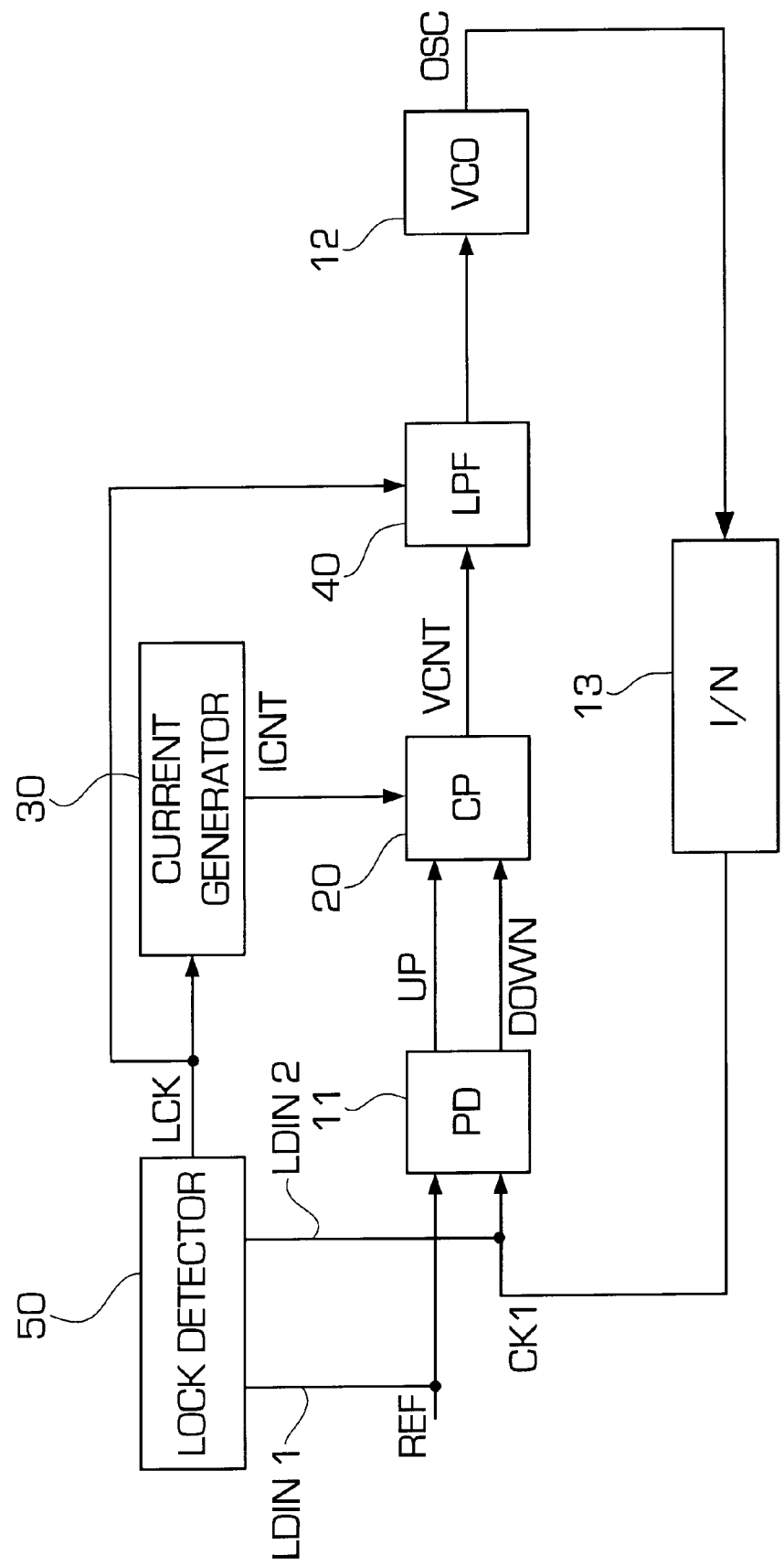

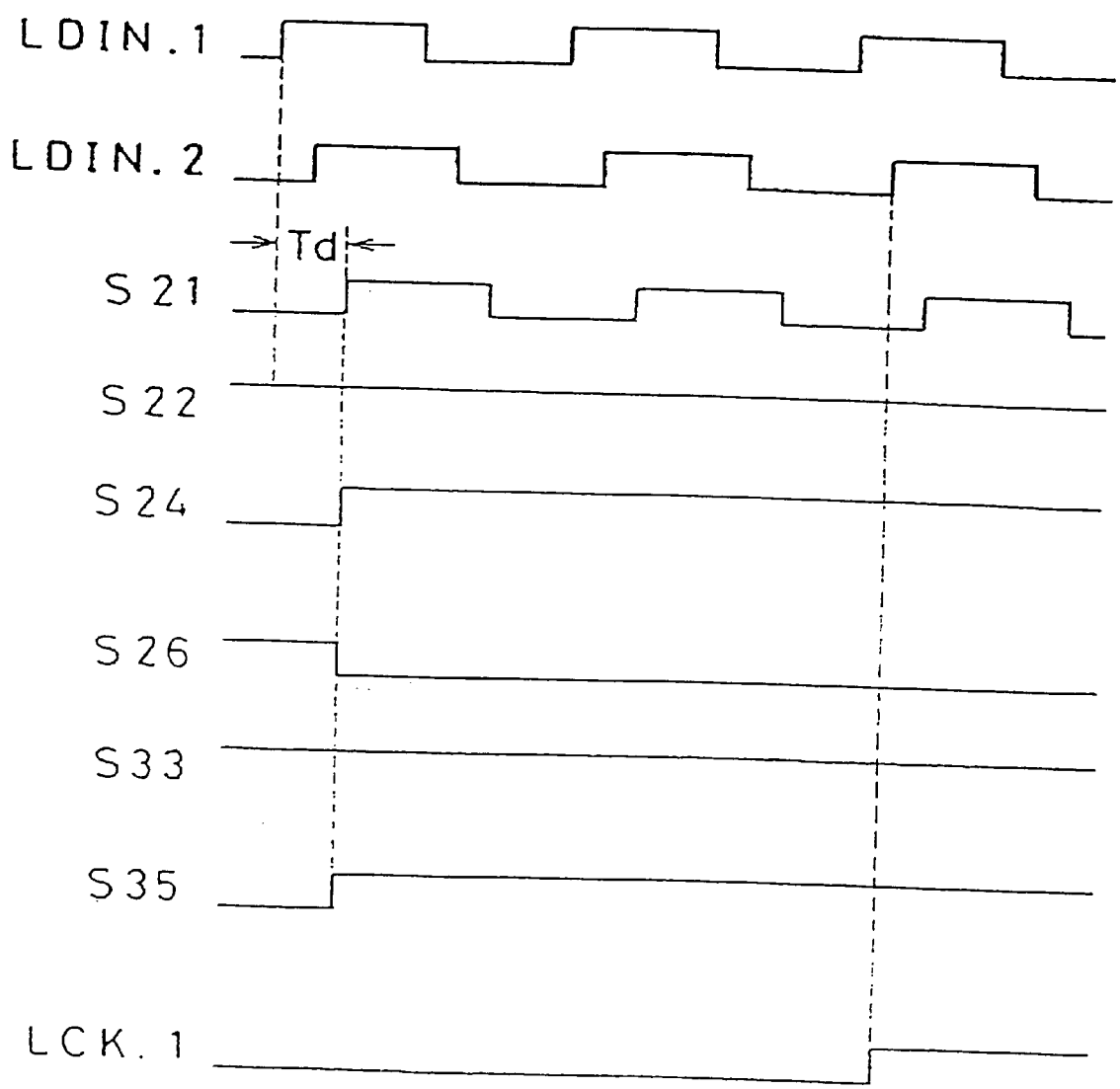

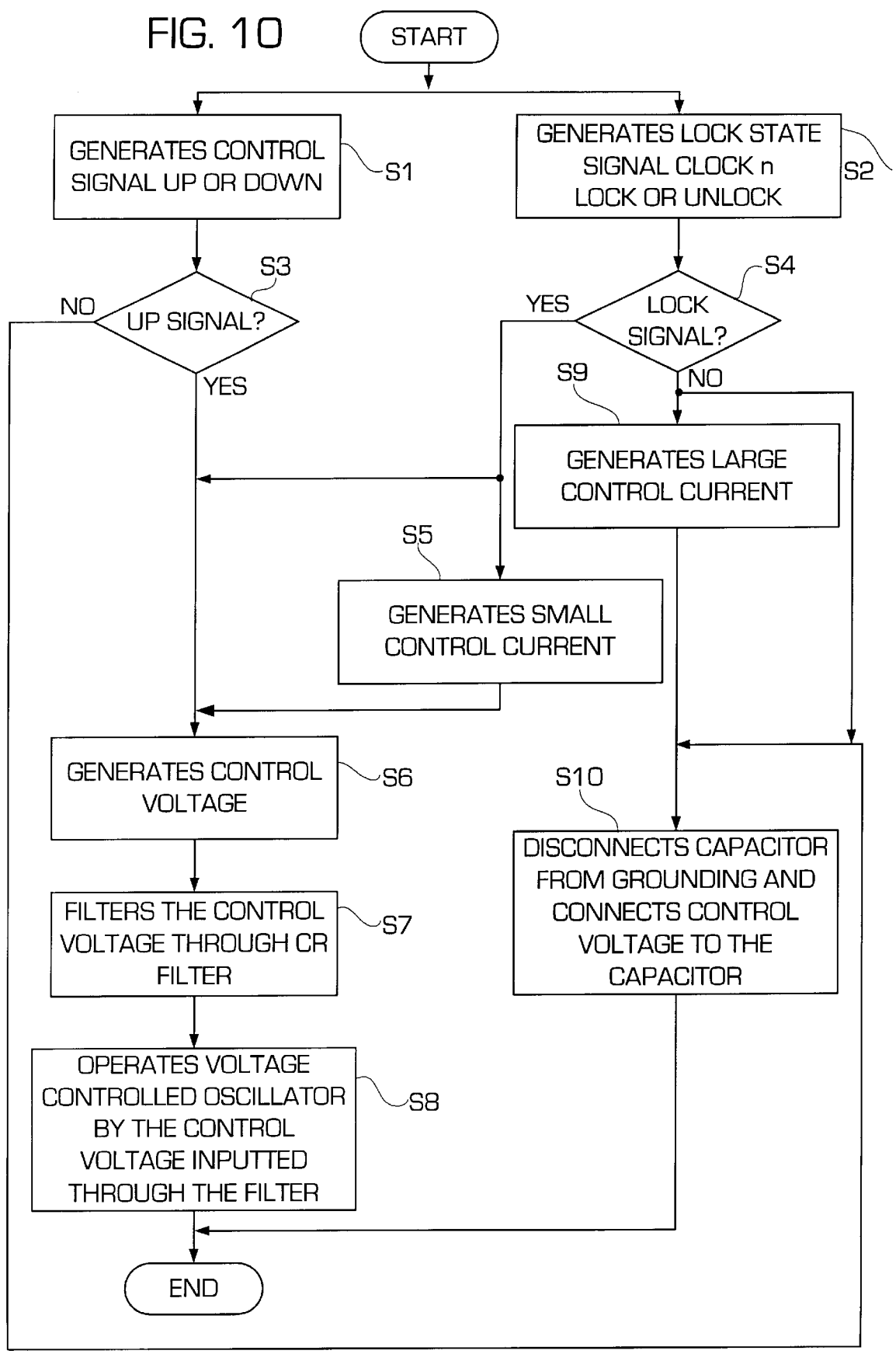

PHASE LOCKED LOOP CIRCUIT AND METHOD OF SYNCHRONIZING INTERNAL SYNCHRONIZING SIGNAL WITH REFERENCE SIGNAL

BACKGROUND OF THE INVENTION

1. Field of the Invention

The present invention relates to a synchronizing signal generating circuit, and more particularly, to a synchronizing signal generating circuit which outputs an internal synchronizing signal having the same frequency and phase as reference signal (a Phase Locked Loop circuit: PLL circuit, or a phase synchronizing loop circuit).

2. Description of the Related Art

FIG. 1 is a block diagram showing a configuration of conventional PLL circuit 100. As shown in FIG. 1, PLL circuit 100 comprises phase detector 101, charge pump 102, loop filter (LPF) 103, voltage controlled oscillator 104, lock detector 105, and current generator 106. Japanese Patent Application Laid-Open No. 30417/95 is herein referred to as a prior art example.

Phase detector 101 compares reference signal REF inputted from the outside thereof with internal synchronizing signal OSC. When there is a difference between their frequencies or phases, the phase difference is inputted to charge pump 102 as an UP or DOWN signal.

Charge pump 102 switches on or off PMOS transistor 112 based on an UP signal from phase detector 101, and leads a current from current source 111 to LPF 103. Charge pump 102 also switches on or off NMOS transistor 113 based on a DOWN signal from phase detector 101, and cuts current source 114 out of LPF 103.

LPF 103 operates in a manner such that capacitor 122 is charged and discharged by charge pump 102 and LPF 103 outputs control voltage VCNT. When both MOS transistors 112 and 113 of charge pump 102 are OFF, the electric charge having been charged in capacitor 122 is retained and control voltage VCNT is kept constant.

VCO 104 outputs internal synchronizing signal OSC in an oscillation frequency corresponding to control voltage VCNT.

By composing a loop with phase detector 101, charge pump 102, LPF 103 and VCO 104, differences in frequencies and phases between reference signal REF and internal synchronizing signal OSC are canceled out, and the frequencies and the phases of internal synchronizing signal OSC and reference signal REF are both locked.

Lock detector 105 detects a locked state by using the difference in the phases between reference signal REF and internal synchronizing signal OSC detected by phase detector 101, and outputs current control signal ICNT.

Current generator 106 controls the currents from current sources 111 and 114 of charge pump 102 in response to current control signal ICNT. For example, if the frequencies and the phases of both internal synchronizing signal OSC and reference signal REF are not locked, the current is increased, and decreased if otherwise.

Another method has also been proposed which switches a configuration of LPF 103 corresponding to the difference in the phases between reference signal REF and internal synchronizing signal OSC detected by phase detector 101. FIG. 2 is a diagram showing a circuit configuration of switching LPF 200.

In an unlocked state, only capacitor 202 becomes effective by making switch 203 and 206 ON and OFF respectively. In this manner, a fluctuation in control voltage VCNT becomes large. Meanwhile, in the locked state, the fluctuation in control voltage VCNT is made small by making switch 206 ON and connecting capacitor 205.

By increasing the current charging into or discharging from capacitor 122 and making the change in control voltage VCNT greater, a lock-up time can be shortened.

Furthermore, by decreasing the current and making the fluctuation in control voltage VCNT small, a fluctuation (jitters) in oscillation frequency appearing after the locked state has been established can be reduced.

However, the conventional PLL circuits in the above have problems which will be described below.

As a first problem, in PLL circuit 100, in the case where charge and discharge from charge pump 102 to LPF 103 is carried out by current sources 111 and 114, a noise shown in FIG. 3 is generated in control voltage VCNT due to an effect caused by the gate-drain capacities of PMOS transistor 112 and NMOS transistor 113 when they are switched on and off. FIG. 3 shows waveforms of UP signal, DOWN signal and an output current from the charge pump.

As has been described above, the method has been proposed which switches the configuration of LPF in response to the locked state between reference signal REF and internal synchronizing signal OSC. However, this method also has a problem which will be described below.

In this method, LPF switches 203 and 206 are connected in the manner shown in FIG. 2. In the unlocked state, switch 203 is ON and switch 206 is OFF.

When reference signal REF is locked to internal synchronizing signal OSC, which makes switch 206 become ON, an electric charge having been stored in capacitor 202 flows into capacitor 205 until voltages of both capacitors become equal. Therefore, control voltage VCNT decreases. At this time, it is possible that the locked state is canceled. As a result, reduction in the lock-up time cannot be realized.

SUMMARY OF THE INVENTION

The present invention has been created based on consideration of the problems described above, and its object is to provide a synchronizing signal generating circuit (a PLL circuit) which realizes a reduction in a lock-up time and jitters, absorbs a noise generated upon switching on and off of a charge pump, and switches a configuration of a loop filter without causing a discharge of a control voltage.

To achieve the above object, a synchronizing signal generating circuit (a PLL circuit) of the present invention comprises a phase detector which inputs a reference signal and an internal synchronizing signal and outputs a control signal corresponding to a phase difference between the reference signal and the internal synchronizing signal, a charge pump which outputs a control voltage based on the control signal, a loop filter which absorbs noise generated by the charge pump and filters the control voltage, and voltage controlled oscillator which outputs the internal synchronizing signal in a frequency corresponding to the control voltage having been filtered.

The loop filter further includes voltage drop preventing means which prevents the generation of noise and a level drop of the control voltage generated by a change between the locked state and the unlocked state.

The voltage drop preventing means comprises; a noise absorbing capacitor connected between a control voltage line and ground; a fixed charge path comprising a predetermined resistor and a charge capacitor and is connected to the noise absorbing capacitor in parallel; and a plurality of switching charge paths each of them comprises at least a switching means for switching the charge path makes in use, a predetermined resistor and a charge capacitor, and means for keeping a voltage corresponding to the control voltage in the charge capacitor in the unlocked state and connecting the charge capacitor through the predetermined resistor to the noise absorbing capacitor in parallel in the locked state.

The means for keeping the voltage corresponding to the control voltage comprises an operational amplifier which inputs the control voltage and connects output directly to the charge capacitor by shortcircuiting the predetermined resistor through a switching means which connects only in the unlocked state.

A synchronizing signal generating method according to the present invention comprising the steps of: inputting a reference signal and an internal synchronizing signal and outputting a control signal corresponding to a phase difference between the reference signal and the internal synchronizing signal; inputting the reference signal and internal synchronizing signal and outputting either a lock signal or an unlock signal in response to whether or not the phase difference between the reference signal and the internal synchronizing signal is locked in a predetermined range; inputting a control voltage corresponding to the control signal; absorbing a noise generated by a change in the control voltage and filtering the control voltage; and outputting the internal synchronizing signal in a frequency corresponding to the filtered control voltage wherein the filtering step comprises a step of preventing a level drop of the control voltage which is generated in association with the change between the locking and unlocked states.

BRIEF DESCRIPTION OF THE DRAWINGS

FIG. 4 is a block diagram showing a first embodiment of a PLL circuit based on the present invention;

FIG. 9 is a chart showing timing of the lock detector in operation.

FIG. 10 is a flowchart of the synchronizing signal generating method.

DESCRIPTION OF THE PREFERRED EMBODIMENTS

Figure 1:
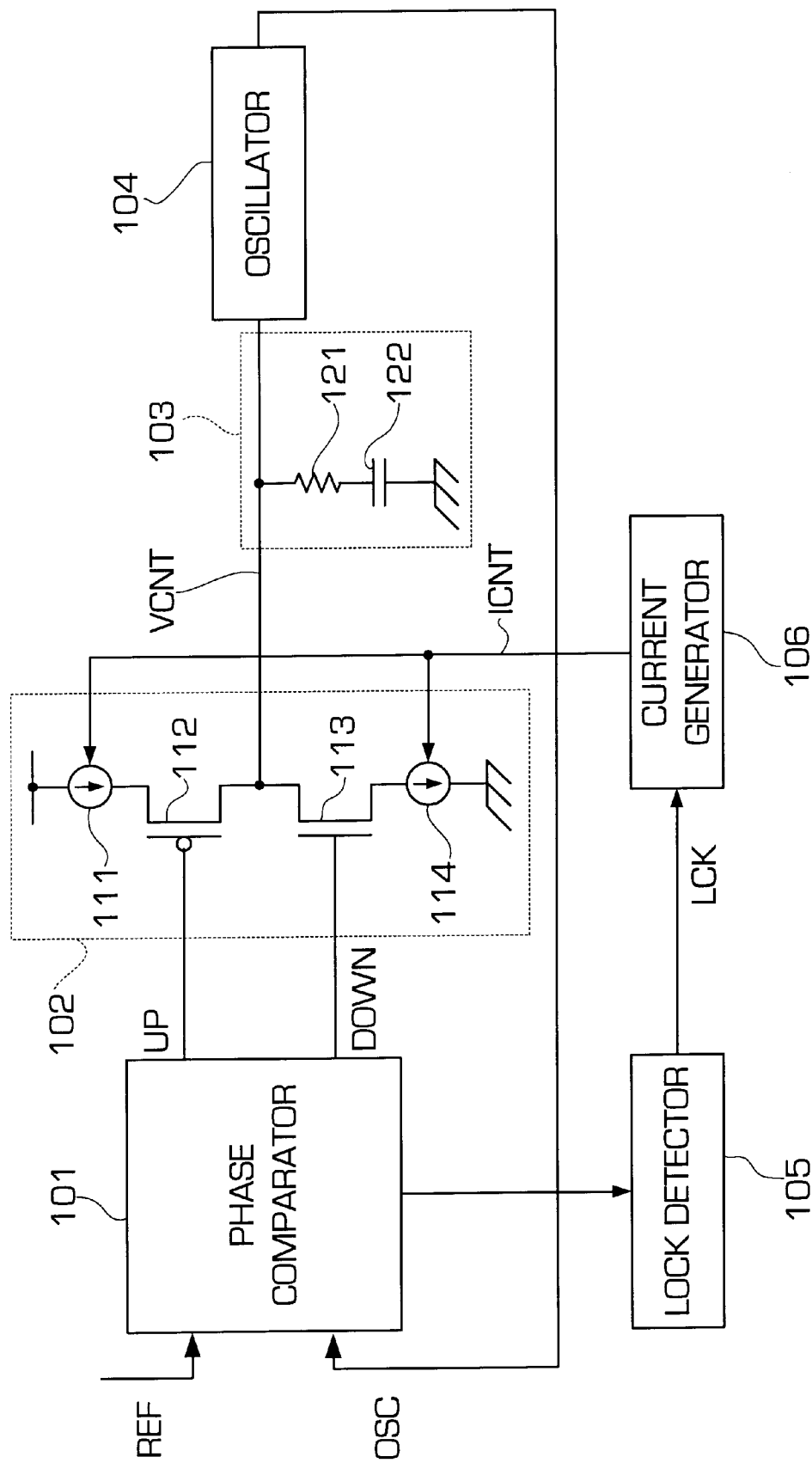
FIG. 1 is a block diagram showing a conventional PLL circuit.

Hereinafter, embodiments of the present invention will be explained with reference to the accompanying drawings. FIG. 4 is a basic block diagram showing a PLL circuit of the present invention.

This PLL circuit generates internal synchronizing signals which synchronizes with reference signals. This PLL circuit comprises a phase detector (PD) which detects a phase difference between the reference signal and the internal synchronizing signal and outputs a first or a second switching signal in response to whether the phase is advancing or delaying, a lock detector which detects a phase locked state in which phase or frequency difference between the reference signal and the internal synchronizing signal is stayed within a predetermined range and outputs a lock signal, a variable current generating circuit which generates a current corresponding to the lock signal, a charge pump (CP) which carries out charging or discharging in response to the current generated by the variable current generating circuit based on the first or the second switching signal and outputs a control voltage, a loop filter (LPF) which carries out filtering on the control voltage and comprises a capacitor for absorbing noise generated upon switching on and off the charge pump, and a voltage controlled oscillator (VCO) which outputs an internal synchronizing signal in a frequency corresponding to the noise filtered control voltage.

In the PLL circuit of the present invention, the variable current generating circuit generates a large current when the lock signal shows an unlocked state, and generates a small current in a locked state.

In the above embodiment, the lock detector may be composed to compare the first switching signal with the second switching signal.

According to the above embodiments of the present invention, charge and discharge of the capacitor in the loop filter is carried out by the current having a value corresponding to the absolute value of the phase difference between the reference signal and the internal synchronizing signal detected by the phase detector, and this charge or discharge is carried out by a current having a large value when the phase difference is large. Therefore, a lock-up time can be shortened.

After the locked state has been established, the phase difference becomes small, and the charge or discharge is carried out by a current having a small value. Furthermore, the noise generated upon switching on and off by the charge pump is absorbed by the capacitor installed in the loop filter. Therefore, reduction in jitters can be realized.

According to the embodiment of the present invention, the constant (the capacity) of the loop filter is switched based on the absolute value of the phase difference between the reference signal and the internal synchronizing signal detected by the phase detector.

When the phase difference is large, the constant of the loop filter is made small and the lock-up time reduction can thus be carried out. When small, the constant (the capacity) of the loop filter is made large and reduction in jitters can be carried out in this manner.

When the constant (the capacity) of the loop filter is switched, reduction in the control voltage and unlock due to a flowing-out electric charge (discharge) are prevented.

Furthermore, since the lock detector is configured so that it operates symmetrically for both the reference signal and the internal synchronizing signal, no operational difference is created between the case where the phase of the internal synchronizing signal is delayed to the reference signal and the case where it is advanced.

Moreover, since the variable current generating circuit and the loop filter can be controlled by a signal output from the same lock detector, separate controlling circuits for the both are not necessary, so that a circuit size reduction is thus possible.

Hereinafter, the embodiments of the present invention will be explained in detail with reference to the accompanying drawings.

FIG. 4 is a block diagram showing a circuit configuration of a PLL circuit related to the first embodiment of the present invention. As shown in this figure, PLL circuit 1 of the present embodiment comprises phase detector (PD) 11, voltage controlled oscillator (VCO) 12, divider (1/N) 13, current controlling charge pump (CP) 20, variable current generating circuit 30, capacity switching low path filter (LPF) 40 and lock detector 50.

Phase detector 11 inputs reference signal REF input from the outside thereof and comparison signal CK1 which has been generated by dividing internal synchronizing signal OSC into 1/N by using divider 13. Phase detector 11 then detects the phase difference between reference signal REF and comparison signal CK1, and outputs control signal UP or DOWN corresponding to the phase difference to charge pump 20 in a succeeding step.

Lock detector 50 inputs reference signal REF and comparison signal CK1, and detects the locked state between the two signals to output lock signal LCK to variable current generating circuit 30.

Variable current generating circuit 30 controls control current ICNT which drives charge pump 20 by switching a current path in response to lock signal LCK.

Charge pump 20 charges or discharges a capacitor in LPF 40 in a succeeding step based on UP or DOWN signal in response to control current ICNT.

Capacity switching LPF 40 controls a fluctuation of control voltage VCNT of voltage controlled oscillator 12 by switching a charge or discharge path in response to lock signal LCK.

Voltage controlled oscillator 12 outputs internal synchronizing signal OSC in a frequency corresponding to control voltage VCNT.

Current controlling charge pump 20 in the embodiment of the present invention will be explained next.

Figure 5:
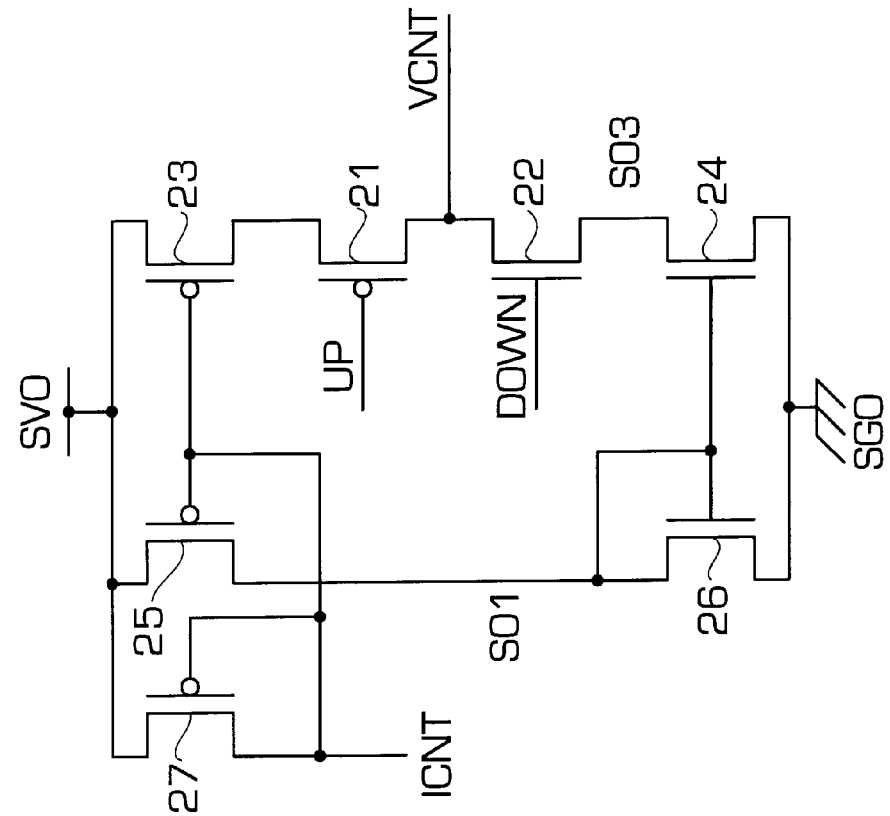
FIG. 5 is a detailed circuit diagram showing a charge pump 20 in FIG. 4.
Figure 2:
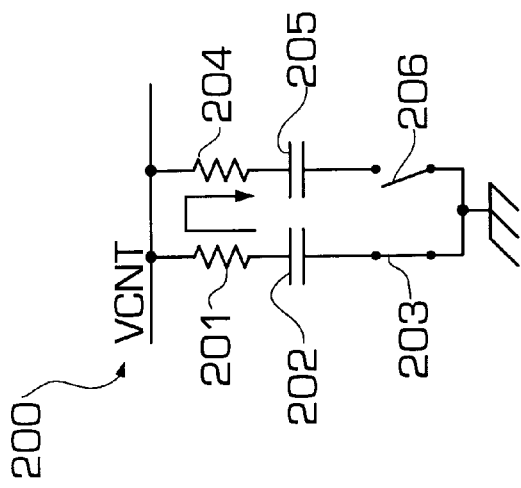
FIG. 2 is a detailed circuit diagram showing a loop filter which has a changeable capacity, unlike that of the loop filter shown in FIG. 1.
Figure 3:
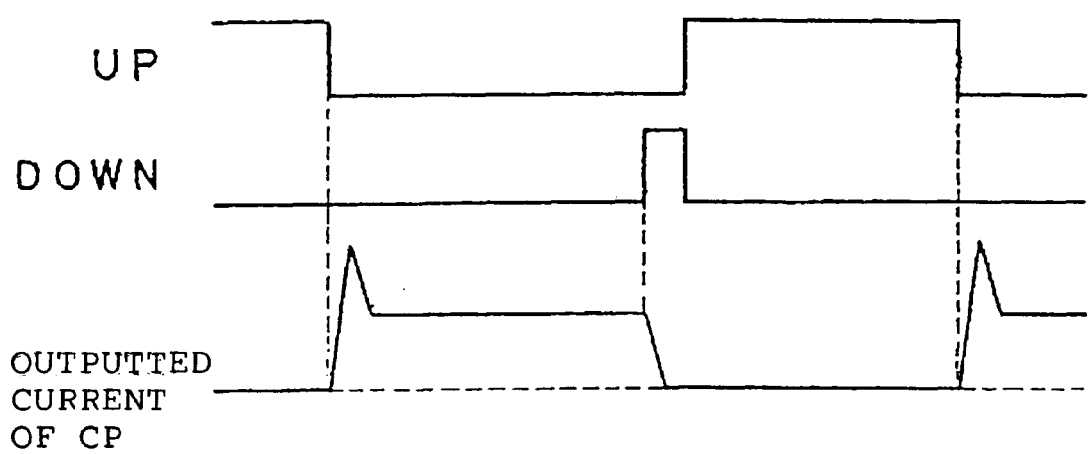
FIG. 3 shows signal waveforms for explaining an operation of a conventional current controlling charge pump.

FIG. 5 is a circuit configuration diagram of current controlling charge pump 20. As shown in FIG. 5, current controlling charge pump 20 comprises MOS transistors 21 and 22 switched on and off by control signal UP and DOWN, and MOS transistors 23 to 27 operating as current sources in response to control current ICNT.

PMOS transistor 23, 25, and 27 composes a first current mirror circuit, and NMOS transistors 24 and 26 composes a second current mirror circuit. If the sizes of the transistors are the same, currents of the same magnitude flow. If otherwise, it is possible to control the current value in response to the sizes of the transistors. Control current ICNT is inputted to PMOS transistor 27 composing the input terminal of the first current mirror circuit, and PMOS transistors 25 and 23 compose the output terminal (the current supplying terminal). NMOS transistor 26 composing the input terminal of the second current mirror circuit is connected to PMOS transistor 25 and the current output from the first current mirror circuit is output from NMOS transistor 24 which is the output terminal of the second current mirror circuit.

Charging of the capacitor in LPF 40 is carried out by switching on and off PMOS transistor 21 by using control signal UP, while discharging of the capacitor in LPF 40 is carried out by switching on and off NMOS transistor 22 by using control signal DOWN.

Figure 6:
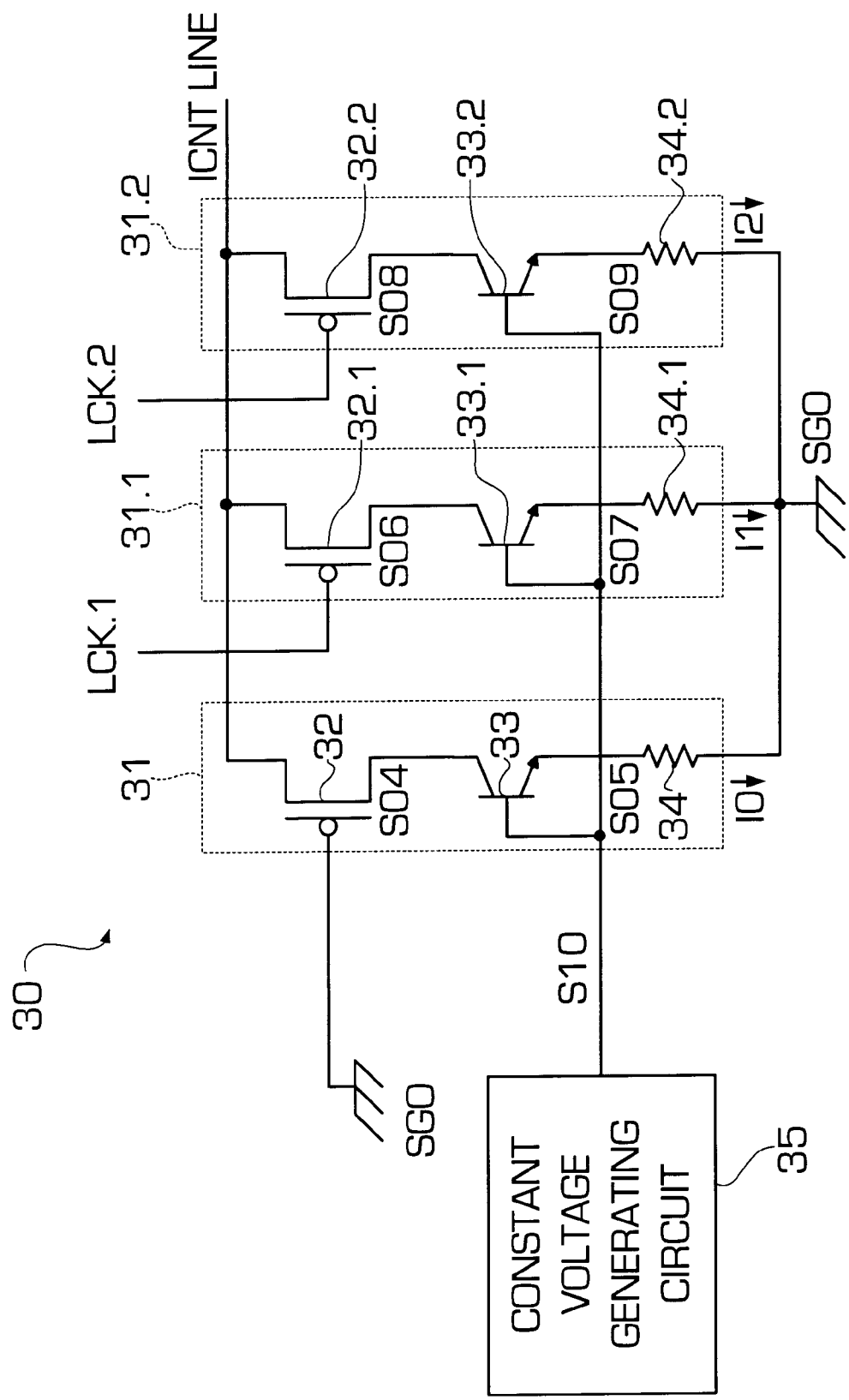
FIG. 6 is a detailed circuit diagram showing a variable current generating circuit 30 in FIG. 4.

Variable current generating circuit 30 in the embodiment of the present invention will be explained next. FIG. 6 is a diagram showing a circuit configuration of variable current generating circuit 30.

As shown in FIG. 6, in current path 31, constant voltage generating circuit 35 is connected to the base terminal of NPN bipolar transistor 33 whose emitter terminal is connected to resistor 34 for controlling a current.

The current generated here is determined by the voltage of constant voltage generating circuit 35 and the resistance of resistor 34. Effectiveness of current path 31 is switched on and off by PMOS transistor 32 connected between the collector terminal of bipolar transistor 33 and ICNT line in which control current ICNT flows.

In FIG. 6, in variable current generating circuit 30, current paths 31.1 and 31.2 are the same as current path 31 and are incorporated in parallel.

In current path 31, the gate terminal of PMOS transistor 32 is connected to ground line SGO and PMOS transistor 32 is always switched on.

PMOS transistor 32.1 is controlled by lock signal LCK.1 while PMOS transistor 32.2 is by lock signal LCK.2.

In an unlocked state, lock signal LCK.1 or LCK 2 is LOW, and PMOS transistor 32.1 or 32.2 in current path 31.1 or 31.2 becomes ON. Therefore, a current having a large value (I0+I1+I2) flows in the path 31.1 or 31.2.

In the locked state, since lock signal LCK.1 is HIGH, PMOS transistor 32.1 in current path 31.1 becomes OFF. Therefore, current I0 having a small value (the current in current path 31) flows.

In current path 31.2, the operation is the same as in current path 31.1, and the explanation thereof is omitted here.

The value of the current flowing in the current path 31.n can be set freely by changing the resistance in each current path. The values may be different for each path. Furthermore, since PMOS transistor 32 is always ON, transistor 32 may not necessarily be installed in the variable current generating circuit (to be independent from the variable current generating circuit). In the present invention, there is no limit in the number of the current paths 31.n and it can take any number as long as the number corresponds to the number of the lock signals LCK.n.

Capacity switching LPF 40 in the embodiment of the present invention will be explained next.

Figure 7:
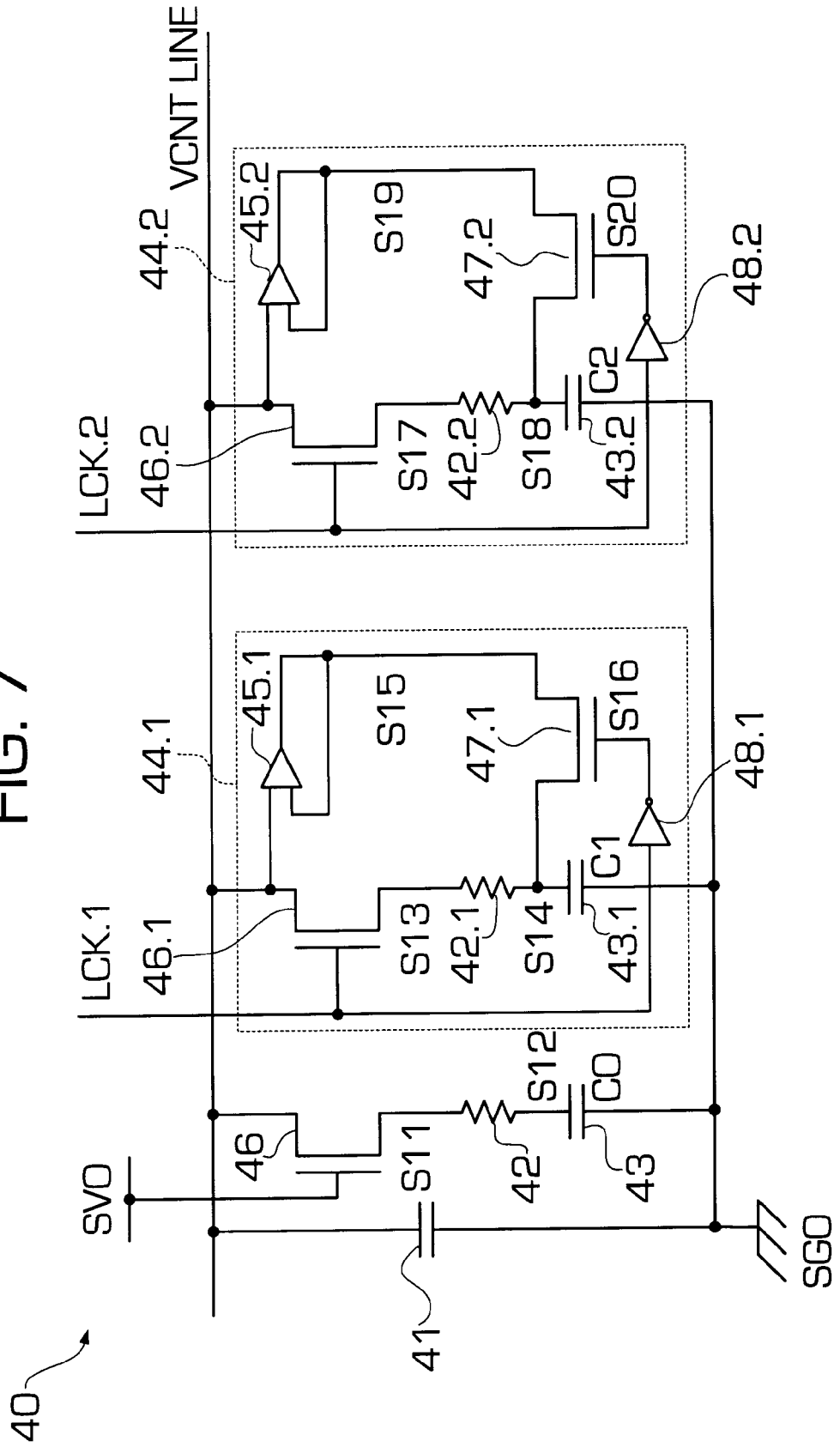
FIG. 7 is a detailed circuit diagram showing a loop filter 40 in FIG. 4.

FIG. 7 is a diagram showing a circuit configuration of LPF 40.

As shown in FIG. 7, capacitor 41 to absorb a noise generated in association with switching on and off the charge pump is connected between VCNT line and ground line SGO whereto control voltage VCNT is applied, in parallel with a charge path comprising capacitor 43 for charging and discharging and resistor 42.

NMOS transistor 46 is connected between resistor 42 and VCNT line. The gate terminal of NMOS transistor 46 is connected to power source line SVO and is always ON.

In switching charge path 44.1, NMOS transistor 46.1, resistor 42.1, and charge capacitor 43.1, all of which are controlled by lock signal LCK.1, are connected in series between VCNT line and ground line SGO.

NMOS transistor controlled by inverted signal S16 of lock signal LCK.1 is connected between nodes S14 and S15. Furthermore, the non-inverting input terminal of operational amplifier 45.1 is connected to control voltage line VCNT, and the inverting input terminal and the output terminal of operational amplifier 45.1 are connected to node S15. In the unlocked state, lock signal LCK.1 is LOW and NMOS transistor 46.1 becomes OFF while NMOS transistor 47.1 becomes ON. At this time, there is no path which leads a current from VCNT line to capacitor 43.1. However, the voltage at node S14 is always kept following control voltage VCNT by operational amplifier 45.1.

When lock signal LCK.1 goes HIGH from this state, NMOS transistor 46.1 becomes ON and NMOS transistor 47.1 becomes OFF. Therefore, a charge path from VCNT line to ground line SGO becomes operable.

At the time the unlocked state changes to the locked state, since node S14 has the same voltage as control voltage VCNT, no electric charge movement due to a voltage difference occurs and reduction in control voltage VCNT can thus be prevented.

In switching charge path 44.2, its operation is the same as that of switching charge path 44.1, and no explanation is provided here.

NMOS transistor 46 is always ON and may not be installed.

Furthermore, there is no limit in the number of the switching charge paths 44.n and the number can be any as long as it corresponds to the number of the lock signals LCK.n.

Figure 8:
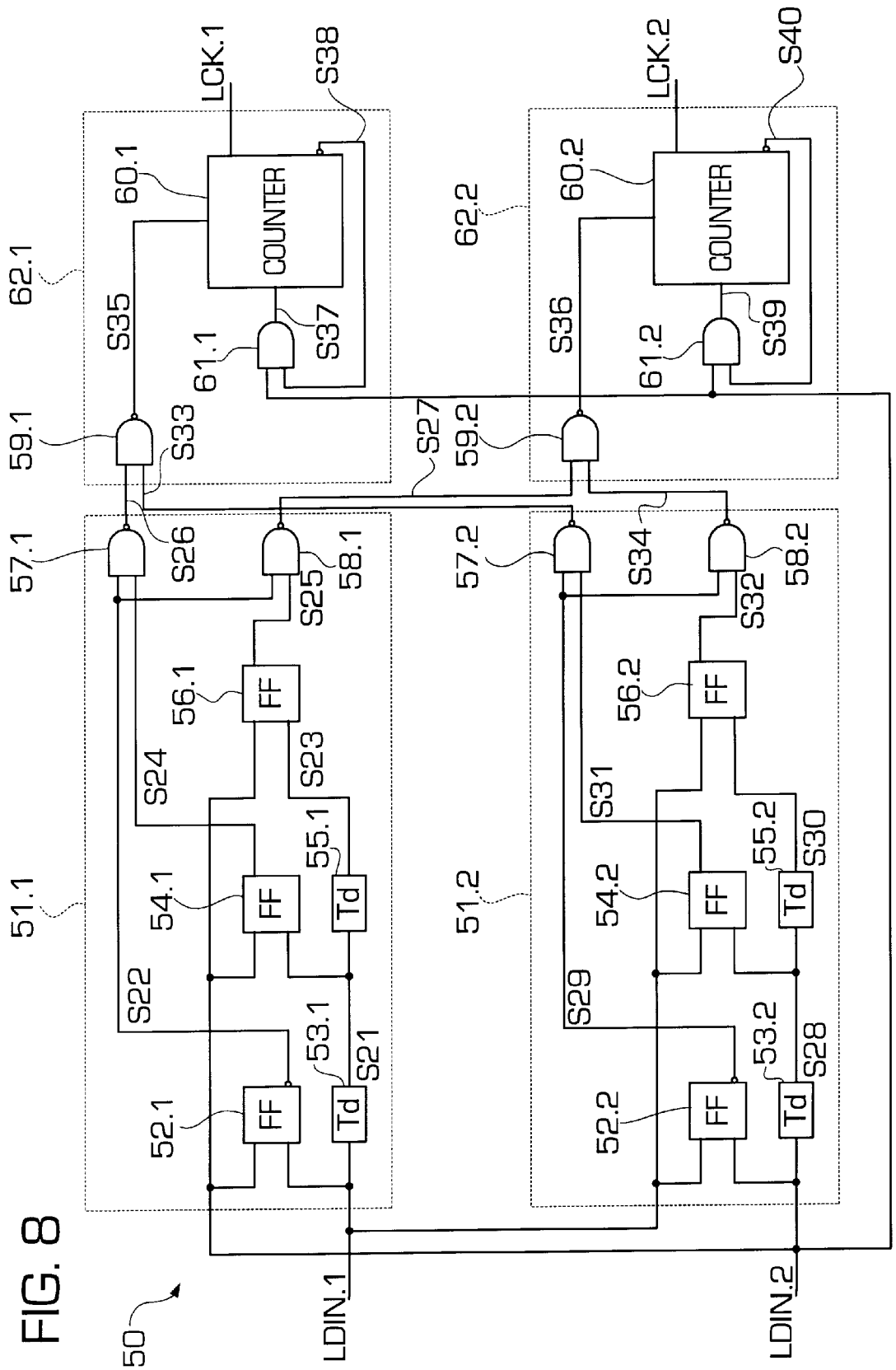
FIG. 8 is a detailed circuit diagram showing a lock detector 50 in FIG. 4.

Lock detector 50 in the first embodiment of the present invention will be explained below. FIG. 8 is a diagram showing a circuit configuration of lock detector 50. In this figure, lock detector 50 comprises lock detecting circuits 51.n (n=1, 2 . . . ) which detect a locked state between two input signals LDIN.1 and LDIN.2, and lock signal generating circuits 62.n.

In lock detecting circuit 51.1, signal S22 (an inverted output from flip flop (F/F) 52.1) which is an inversion of input signal LDIN.2 latched at the timing when input signal LDIN.1 rises, and signal S24 (an output from flip flop 54.1) which is input signal LDIN.2 latched at the timing when signal S21, which is input signal LDIN.1 just passing delay circuit (Td) 53.1, rises are input to NAND gate 57.1.

If the rise of input signal LDIN.2 is between the rise of input signal LDIN.1 and the rise of delay signal S21, NAND gate 57.1 outputs a signal (lock detecting signal S26) at the low level and outputs the signal at the high level if otherwise.

When locking conditions are switched in two steps, delay signal S21 is further led to delay circuit 55.1 to obtain second delay signal S23. At the timing when second delay signal S23 rises, signal S25 which is input signal LDIN.2 having been latched and signal S22 are input to NAND gate 58.1 to obtain second lock detecting signal S27.

In lock detecting circuit 51.2, the same operation as in lock detecting circuit 51.1 is carried out except that input signal LDIN.1 is replaced by input signal LDIN.2 and vice versa. Therefore, its explanation is omitted here.

If either lock detecting signal S26 from lock detector circuit 51.1 or lock detecting signal S33 from lock detector circuit 51.2 is LOW, reset signal S35 in lock signal generating circuit 62.1 (the output from NAND gate 59.1 to which lock detecting signals S26 and S33 are input) goes HIGH and counter 60.1 starts operating.

Counter 60.1 counts the rises of input signal LDIN.2, and outputs lock signal LCK.1 after it has counted a predetermined number (for example, 3).

After lock signal LCK.1 has been output, counter 60.1 suspends its operation until reset signal S35 goes LOW.

When second lock signal LCK.2 is used, second lock detecting signals S27 and S34 are inputted to second lock signal generating circuit 62.2, and second lock signal LCK.2 is outputted through the same operation as in lock signal generating circuit 62.1.

The lock signals LCK.n are LOW in the unlocked state, and HIGH in the locked state.

FIG. 9 is a chart showing timing until lock signal LCK.1 is output in the embodiment of the present invention. A binary counter is used as counter 60.1 as an example. When either lock detecting signal S26 or S33 is at the low level, reset signal S35 of lock signal generating circuit 62.1 goes HIGH and counter 60.1 starts operating. Counter 60.1 counts the rises of input signal LDIN.2. After it has counted a predetermined number, it makes lock signal LCK.1 active and suspends counting until reset signal S35 goes LOW. Input signal LDIN.1 may be used as the input signal to drive the counter.

When a lock signal in a third or thereafter circuits are used additionally, necessary delay circuits, flip flops and NAND gates are added to the lock detecting circuit 51.n. The third or thereafter lock signal generating circuits which receive the third or thereafter locking detecting signals are also added.

A method of synchronizing an internal synchronizing signal to a reference signal is explained hereinafter.

FIG. 10 shows a flowchart of the synchronizing signal generating method according to the present invention.

At first, a reference signal such as frequency from a crystal oscillator shall be inputted and generates control signal from phase difference between the reference signal and internal synchronizing signal (step-S1).

On the other hand, a state signal (LCK signal) which shows whether the phase difference between the reference signal and the internal synchronizing signal keeps within a predetermined range or not is generated(step-S2).

When the control signal shows an "up" signal(step-S3), a charge capacitor shall be connected to filter circuit and charged with a control voltage VCNT(step-S5).

When the control signal shows an "down" signal, the charge capacitor shall be disconnected from the filter circuit keeping the control voltage VCNT in the capacitor (step-S6).

When the lock signal is generated due to the phase difference being stayed within the range (step-S4), a control current corresponding to the lock signal is generated (step-S7).

When the unlock signal is generated due to the phase difference being exceeded the range(step-S4), a control current corresponding to the unlock signal is generated (step-S8).

A control voltage VCNT generated by the control current is filtered through the RC filter circuit including the charge capacity (step-S9).

Control voltage VCNT which is generated based on the unlock signal is filtered through the RC filter circuit without the charge capacitor which is disconnected by step-S6 (step-10).

An internal synchronizing signal is generated according to the control voltage inputted through filtering steps S9 and S10 (step-11).

As has been described above, according to the present invention, effects which will be described below are obtained.

In the present invention, the PLL circuit operates without transmitting a noise to the voltage controlled oscillator, and reduction in jitters in the locked state can be realized.

This is because the PLL circuit operates without transmitting noise to the voltage controlled oscillator, since the noise generated upon switching on and off of the current controlling charge pump is absorbed by the capacitor in the loop filter.

The present invention also reduces the lock-up time.

This is because the value of the current which drives the charge pump and the constant of the loop filter are changed in response to the absolute value of the phase difference between the reference signal and the internal synchronizing signal so that charge and discharge of a small capacitance is carried out by a large current when the phase difference is large. Furthermore, if the phase difference is small, charge and discharge of a large capacitance is carried out by a small current, which leads to reduction in jitters.

The present invention can also shorten the lock-up time by preventing reduction in the control voltage generated upon switching the LPF constant.

Moreover, the present invention can realize circuit size reduction.

This is because the current value and the LPF constant are changed by the same lock signal, which makes separate control circuits therefor unnecessary in the present invention.

What is claimed is:

1. A synchronizing signal generating circuit comprising:
    a phase detector receiving as input a reference signal and an internal synchronizing signal and outputting a control signal, up or down signal, corresponding to a phase difference between the reference signal and the internal signal;
    a locked state detector receiving as input the reference signal and the internal synchronizing signal and outputting a lock signal showing a locked state when the phase difference is within a predetermined range and outputting an unlock signal showing an unlocked state when the phase difference is output the predetermined range;
    a current generator for generating a corresponding control current in accordance with the lock signal and unlock signal;
    a charge pump for outputting a control voltage corresponding to the control current;
    a loop filter for filtering the control voltage by switching a loop constant whereby capacity is cumulatively raised when the lock signal is inputted and the capacity is reduced when the unlock signal is inputted; and
    a voltage controlled oscillator for outputting the internal synchronizing signal in a frequency corresponding to the inputted filtered control voltage;
    wherein said loop filter further includes voltage drop preventing means for preventing a generation of noise and a level drop of the control voltage caused by a change between the locked state and the unlocked state.

2. A synchronizing signal generating circuit as claimed in claim 1, wherein the voltage drop preventing means comprises:
    a noise absorbing capacitor connected between a control voltage line and ground;
    a plurality of switching charge paths each of them comprises at least a switching means for switching the charge path makes in operative, a predetermined resistor and a charge capacitor, and means for keeping voltage of the charge capacitor corresponding to the control voltage in the unlocked state and connecting the charge capacitor with the serially connected predetermined resistor between the control voltage line and ground in the locked state.

3. A synchronizing signal generating circuit claimed in claim 2, wherein the means for keeping the voltage in the charge capacitor corresponding to the control voltage comprises an operational amplifier which inputs the control voltage and connects output directly to the charge capacitor by shortcircuiting the predetermined resistor through switching means which connects only in the unlocked state.

4. A synchronizing signal generating method comprising the steps of:
    detecting a phase difference between an inputted reference signal and an internal synchronizing signal and outputting a control signal showing an up/down representation in accordance with the value of phase difference;
    detecting the phase difference to output a lock signal when the phase difference is kept within a predetermined range showing a locked state and to output an unlock signal when the phase difference exceeds the predetermined range showing an unlocked state;
    generating a respective control electric current corresponding to the lock signal and the unlock signal;
    generating a control voltage in accordance with control signal up and down;
    connecting at least a charge capacitor within a loop filter in accordance with the control current and charging the capacitor with the control voltage when the control signal shows an up signal and discharging the capacitor when the control signal shows a down signal corresponding to the inputted control electric current;
    changing capacitance within the loop filter according to the locked state or unlocked state, wherein capacitance is cumulatively connected; and
    generating a corresponding internal synchronizing signal corresponding to the control voltage inputted through the filtering: wherein
        the filtering step includes a step of keeping the control voltage at each charging capacitor during the unlocked state.

5. A synchronizing signal generating circuit comprising:
    a loop filter which comprises capacitance and provides a control voltage;
    a voltage controlled oscillator which outputs a synchronizing signal corresponding to the control voltage;
    a phase detector, which measures a phase difference between a reference signal and the synchronizing signal, and outputs a phase control signal as a function of the measured phase difference;
    a first locked state detector, which measures the phase difference between the reference signal and the synchronizing signal, and outputs a lock signal when the phase difference is within a predetermined range and outputs an unlock signal when the phase difference is outside the predetermined range;
    a current generator which produces a control current; and
    a charge pump which charges and discharges the capacitance within said loop filter, utilizing the control current and based on the phase control signal, whereby the control voltage is generated;
    wherein the capacitance within said loop filter comprises:
        a fixed capacitance which provides constant capacitance; and
        a first switched capacitance which is controlled by said first locked state detector, and is added in parallel to the fixed capacitance when the lock signal is received, and which, when the unlock signal is received, is disconnected from said fixed capacitance and is held at a charge corresponding to the control voltage wherein, when said first switched capacitance is disconnected from said fixed capacitance, there is no path which leads current from said charge pump to said first switched capacitance.

6. A synchronizing signal generating circuit as claimed in claim 5, wherein the control current produced by said current generator is greater when the unlock signal is received from said first locked state detector than the control current produced when the lock signal is received.

7. A synchronizing signal generating circuit as claimed in claim 5, wherein the charge on the first switched capacitance, when disconnected from said fixed capacitance, is maintained by a voltage follower, and wherein said voltage follower has an input, into which substantially no current flows, connected to the control voltage.

8. A synchronizing signal generating circuit as claimed in claim 7, wherein said voltage follower comprises an operational amplifier in a unity-gain configuration.

9. A synchronizing signal generating circuit as claimed in claim 5, further comprising a second locked state detector,
wherein the predetermined range of each locked state detector is unique, and
wherein the locked state detectors sequentially change from outputting unlock signals to lock signals as the phase difference between the reference signal and the synchronizing signal decreases.

10. A synchronizing signal generating circuit as claimed in claim 9, wherein the capacitance of said loop filter further comprises a second switched capacitance, wherein the second switched capacitance is controlled by said second locked state detector.

11. A synchronizing signal generating circuit as claimed in claim 9, wherein said current generator comprises:
a fixed current generator, which supplies constant current;
a first switched current generator controlled by said first locked state detector, said first switched current generator connected in parallel to the fixed current generator when the unlock signal is received, and disconnected when the lock signal is received; and
a second switched current generator, controlled by said second locked state detector, said second switched current generator connected in parallel to the fixed current generator when the unlock signal is received, and disconnected when the lock signal is received;
wherein the control current corresponds to a sum of the current generators connected in parallel.

* * * * *